United States Patent
Shimizu et al.

[19]

[11] Patent Number: 5,943,256
[45] Date of Patent: *Aug. 24, 1999

[54] NONVOLATILE FERROELECTRIC MEMORY

[75] Inventors: Mitsuru Shimizu, Kawasaki; Sumio Tanaka, Tokyo, both of Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/002,391

[22] Filed: Jan. 2, 1998

[30] Foreign Application Priority Data

Jan. 7, 1997 [JP] Japan ..................... 9-011936

[51] Int. Cl.$^6$ ................... G11C 11/22
[52] U.S. Cl. ............ 365/145; 365/185.08; 365/210
[58] Field of Search ................. 365/145, 210, 365/185.08

[56] References Cited

U.S. PATENT DOCUMENTS 4,339,766  7/1982  Rao ............................ 357/47
5,016,216  5/1991  Ali ............................. 365/185
5,148,063  9/1992  Hotta .......................... 307/530
5,241,497  8/1993  Komarek ....................... 365/104
5,502,681  3/1996  Park ........................... 365/210
5,694,369  12/1997 Abe ............................ 365/210

Primary Examiner—David Nelms
Assistant Examiner—Hien Nguyen
Attorney, Agent, or Firm—Banner & Witcoff, Ltd.

[57] ABSTRACT

A nonvolatile ferroelectric memory comprises a memory cell array having memory cells arranged as a matrix array and each including a charge transfer transistor having a source or drain region connected to a bit line and a gate connected to a word line and a ferroelectric capacitor for information storage having one electrode connected to a plate line and the other electrode connected to the drain or source region of the charge transfer transistor. A first dummy line is arranged outside a bit line formed at an end of the memory cell array and second dummy bit lines are arranged between the bit line at the end of the memory cell array and the first dummy bit line. Dummy memory cells are connected to the second dummy bit line and have the same in configuration and size as the memory cells connected to the bit line.

40 Claims, 8 Drawing Sheets

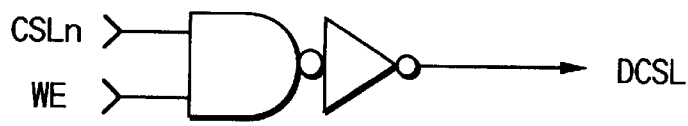
FIG. 7
| MATERIAL | CHEMICAL FORMULA | CURIE POINT (°C) | REMNANT POLARIZATION ($\mu C/cm^2$) | COERCIVE ELECTRIC FIELD (KV/cm) | RELATIVE DIELECTRIC CONSTANT |
|---|---|---|---|---|---|
| LEAD ZIRCONATE TITANATE (PZT) | $PbZrTiO_3$ | 387 | ~30 | ~20 | 1000 |
| BARIUM TITANATE (BTO) | $BaTiO_3$ | 130 | 26 | 1.2 | 1000 |
FIG. 9
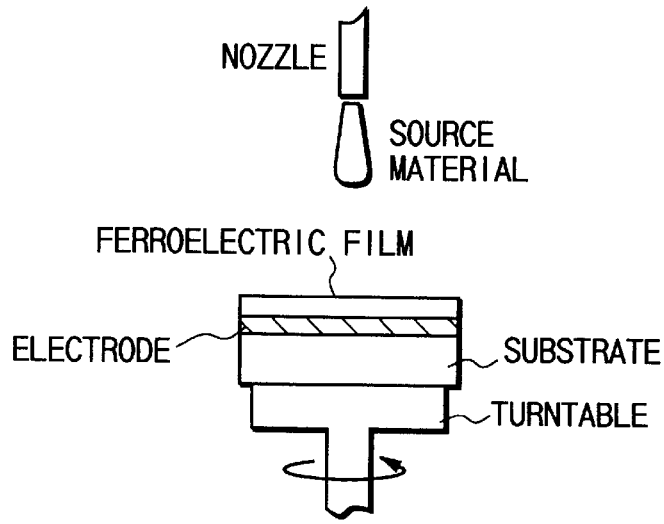
FIG. 10

NONVOLATILE FERROELECTRIC MEMORY

BACKGROUND OF THE INVENTION

The present invention relates to a nonvolatile ferroelectric memory and, in particular, to a structure for compensating for a capacitive coupling of a bit line at an end of a memory cell array.

A nonvolatile ferroelectric memory using a ferroelectric film as an information storage capacitor has recently been actively researched and developed as a semiconductor storage device of a low dissipation power. For example, the nonvolatile ferroelectric memory using ferroelectric memory cells is described in detail in U.S. Pat. 4,873,664 (Eaton, Jr.) and S. S. Eaton, Jr., et al. "A ferroelectric DRAM Cell for High Density NVRAMs", ISSCC Digest for Technical Papers, PP. 130, February 1988, and so on.

As an information storage capacitor for a ferroelectric memory cell, use is made of a ferroelectric film, etc., formed of barium titanate ($BaTiO_3$), lead zirconate titanate ($Pb(Zr, Ti)O_3$:PZT), lanthanum doped lead titanate zirconate (($Pb, La$) ($Zr, Ti)O_3$; PLZT), lithium niobate ($LiNbO_3$), (potassium lithium niobate) ($K_3 Li_2Nb_5O_{15}$), etc. These ferroelectric films, being supplied with a voltage, produce a polarization. And the voltage/polarization relation reveals what is called a hysteresis characteristic.

Generally, a memory cell section of a semiconductor memory comprises a memory cell array comprised of a matrix array of memory cells. A respective memory cell array has a functionally irrelevant dummy interconnect line at its outer edge portion, such as dummy lines and dummy bit lines. The dummy interconnect line is provided so as to prevent the thinning of an interconnect line at a specific site, as well as an unbalance, at a time of manufacture and, in use, a given potential, such as a power supply potential Vss, is connected to the dummy interconnect line.

Generally, the semiconductor memory uses many repeated blocks of the same pattern. For example, use is made of, for example, a row decoder, column decoder, a plurality of memory cell sections having a plurality of memory cell array as a repeated block. In the case where patterning is effected from a repeated section to a non-repeated section, there sometimes occurs a case where interconnect lines are narrowed due to the configuration of the semiconductor substrate's surface, a photo-proximity effect, etc. In particular, there occurs such a phenomenon at a cell for which a design rule is stricter. For example, only a bit line at one extreme end position is made narrower than the remaining ones. As a result, their associated bit lines differ in their capacitances and hence the bit line pair involved have its sense margin deteriorated and the same thing is also true of the word line.

In order to improve, for example, the thinning of such an interconnect line and unbalance of the pattern, the above-mentioned dummy line is provided outside the word and bit lines and the dummy word line and dummy bit line are electrically connected to a given potential, such as a power supply potential Vss.

In the ferroelectric memory, a memory cell at the end side of the memory cell array is operated in an environment different from that in which other memory cell arrays are arranged. In this case, the bit line at the end of the memory cell array is arranged adjacent to the dummy bit line on the outer side. When, with the dummy bit line fixed to Vss, "1" data is to be read out of the bit line at the end of the memory cell array, its read-out margin to "1" is decreased due to a capacitive coupling of the dummy bit line Vss to the bit line. Even if the data is correctly written in some case, there may sometimes occurs a case where the data cannot be read out.

BRIEF SUMMARY OF THE INVENTION

It is accordingly the object of the present invention to provide a nonvolatile ferroelectric memory for effectively compensating for a capacitive coupling of a bit line at an end of a memory cell array located inside an outside dummy line.

In order to achieve the above-mentioned object of the present invention there is provided a nonvolatile ferroelectric memory comprising;

a memory cell array having a plurality of memory cells arranged in rows and columns, each of the memory cells comprising a charge transfer transistor having a source and a drain region and a gate electrode and a ferroelectric capacitor for information storage which has two electrodes, one of the two electrodes being connected to one of the source and the drain region of the transistor;

a plurality of word lines each connected to the gate electrode of the transistor in each of the memory cells;

a plurality of plate lines each connected to the other of the two electrodes of the ferroelectric capacitor in each of the memory cells;

a plurality of bit lines each connected to the other of the source and the drain region of the transistor in each of the respective memory cells;

a first dummy bit line arranged outside the memory cell array and substantially parallel to the bit line; and second dummy bit lines arranged between the memory cell array and the first dummy bit line and constituting a dummy bit line pair.

The second dummy lines are preferably connected to dummy memory cells which are substantially the same in configuration and size and in number as those memory cells connected to one of the bit lines arranged at the end of the memory cell array, the dummy memory cells being connected to corresponding ones of the word and the plate lines.

The first dummy bit line is preferably fixed to a predetermined potential.

The second dummy bit lines, together with the plurality of bit lines, vary in potential.

Both the plurality of bit lines and the second dummy bit lines constitute pairs of signal lines supplied with complementary signals and the plurality of memory cells are connected to the pair of signal lines correspondingly.

Dummy memory cells are connected to each of the second dummy bit lines and each of the dummy memory cells comprises a dummy transistor for charge transfer which has a source and a drain region one of which connected to one of the second dummy bit lines and a gate connected to the corresponding one of the word lines and a dummy ferroelectric capacitor for information storage which has one electrode connected to a corresponding one of the plate lines and the other electrode connected to the other of the source and the drain region of the dummy transistor.

The dummy memory cells equal in number to those memory cells connected to each of the bit lines are preferably connected to each of the second dummy bit lines.

The nonvolatile ferroelectric memory preferably further comprises a sense amplifier and I/O gates connected to the second dummy bit lines.

The second dummy bit lines are connected to input/output lines by opening the I/O gates when data is written and disconnected from the input/output lines by closing the I/O gates when data is read out.

Mutually opposite level signals are preferably transferred to one of the bit lines at the end of the memory cell array, and one of the second dummy bit lines adjacent to the one of the bit lines.

A column address of one of the bit lines at the end of the memory cell array preferably coincides with a column address of adjacent one of the second dummy bit lines.

A nonvolatile ferroelectric memory of a second aspect comprises:

a memory cell array having a plurality of memory cells arranged in rows and columns, each of the memory cells comprising a charge transfer transistor having a source and a drain region and a gate electrode and a ferroelectric capacitor for information storage which has two electrodes, one of the two electrodes being connected to one of the source and the drain region of the transistor;

a plurality of word lines each connected to the gate electrode of the transistor in each of the memory cells;

a plurality of plate lines each connected to the other of the two electrodes of the ferroelectric capacitor in each of the memory cells;

a plurality of bit lines each connected to the other of the source and the drain region of the transistor in each of the memory cells;

at least one dummy bit line arranged outside the memory cell array and substantially parallel to the bit lines and connected to dummy memory cells which are substantially the same in configuration and size and in number as those memory cells connected to one of the bit lines at the end of the memory cell array, the dummy memory cells being connected to the corresponding one of the word and the plate lines.

The at least one dummy bit line includes two dummy bit lines to form a dummy bit line pair to which mutually complementary signals are preferably transferred.

The dummy bit line pair desirably has a pattern substantially the same as that of a bit line pair at the end of the memory cell array.

The nonvolatile ferroelectric memory is preferably of such a type that bit line pair include a first bit line to which first data is transferred and a second bit line to which data complementary to the first data is transferred, the dummy bit line pair include a first dummy bit line to which second data is transferred and a second dummy bit line to which data complementary to the second data is transferred, a second bit line of the bit line pair at the end of the memory cell array is arranged adjacent to the first dummy bit line of the dummy bit line pair, and the complementary data to the first data transferred to the second bit line and second data transferred to the first dummy bit line have substantially the same level.

A nonvolatile ferroelectric memory of still another aspect of the present invention comprises a memory cell array having a plurality of memory cells arranged in rows and columns, each of the memory cells comprising a charge transfer transistor having a source and a drain region and a gate electrode and a ferroelectric capacitor for information storage which has two electrodes, one of the two electrodes being connected to one of the source and the drain region of the transistor;

a plurality of word lines each connected to the gate electrode of the transistor in each of the memory cells;

a plurality of plate lines each connected to the other of the two electrodes of the ferroelectric capacitor in each of the memory cells;

a plurality of bit lines each connected to the other of the source and the drain region of the transistor in each of the memory cells; and a dummy bit line pair arranged outside the memory cell array and substantially parallel to the bit lines, wherein the plurality of bit lines form a plurality of bit line pairs; a bit line pair at the end of the memory cell array includes a first bit line to which first data is transferred and a second bit line to which data complementary to the first data is transferred; the dummy bit line pair includes a first dummy bit line to which second data is transferred and a second dummy bit line to which data complementary to the second data is transferred; a second bit line of the bit line pair at the end of the memory cell array is arranged adjacent to the first dummy bit line of the dummy bit line pair; and the complimentary data to the first data transferred to the second bit line and the second data transferred to the first dummy bit line have substantially the same level.

A plurality of dummy memory cells are connected to each of the first and the second dummy bit lines, each of the dummy memory cells preferably comprising a charge transfer transistor having a source and a drain region, one of which is connected to the corresponding dummy bit line, and a gate electrode connected to a corresponding one of the word lines and a ferroelectric capacitor for information storage having one electrode connected to a corresponding one of the plate lines and the other electrode connected to the other of the source and the drain region of the charge transfer transistor.

The memory cells and the dummy memory cells preferably have substantially the same configuration and size.

The dummy memory cells connected to each of the first and the second dummy bit lines are equal in number to the memory cells connected to any one of the bit lines.

Each of the word and the plate lines is connected to the memory cells and the dummy memory cells in the same one of the rows and each of the bit lines is connected to the memory cells in the same one of the columns.

That is, the present invention is characterized in that, in a nonvolatile ferroelectric memory where the first dummy line for uniformly forming an interconnect line such as a dummy bit line is provided at an outer end of the memory cell array, a second dummy bit line is inserted between the first dummy line and a bit line at the end of the memory cell array. In the present invention, the memory cell array is intended to mean a location where memory cells connected to bit lines, word lines and plate lines are collected to allow the transfer of real data, that is, a target object of memory. The same thing is also true of the memory cell array as will be set out below. That is, even if the memory cells are of such a type as to have the same structure as set out above, they are outside the memory cell array if the memory cells are connected to the dummy bit line.

According to the present invention, the first dummy bit line for achieving uniform work in manufacture is electrically fixed to a given potential and the second dummy line is connected to the corresponding memory cells relative to the same column as in the case of the bit line. However, the second dummy bit line persistently functions to compensate for a capacitive coupling on a bit line at an end of the memory cell array.

That is, when "1" data is to be read from the bit line at an end of the memory cell array, if the bit line is formed near the first dummy bit line to which a fixed potential such as Vss is applied, less margin to read out "1" is left due to a capacitive coupling between the bit line and the first dummy bit line (Vss). By providing the bit line at the end of the memory cell array in a position near the second dummy bit line, not the first dummy bit line, it is possible to eliminate its effect over the first dummy bit line.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a view showing, in a memory cell array of the present invention, a logic circuit for generating a column select signal supplied to a second dummy bit line;

FIG. 9 is a view showing the characteristic of a ferroelectric film used in the embodiment of the present invention;

FIG. 10 is a view for explaining a principle of a sol/gel method;

DETAILED DESCRIPTION OF THE INVENTION

An embodiment of the present invention will be explained below with reference to the drawings.

Figure 1:
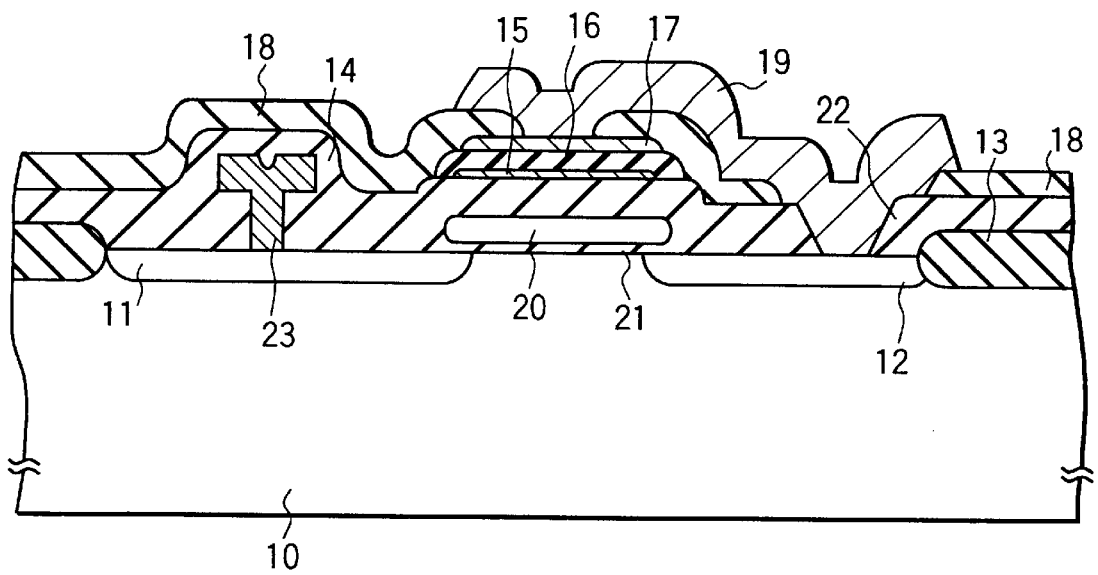
FIG. 1 is a cross-sectional view showing a ferroelectric memory cell in an embodiment of the present invention.

FIG. 1 is a cross-sectional view showing a memory cell in a nonvolatile ferroelectric memory (a semiconductor memory device). As a semiconductor substrate use is made of a P type silicon substrate 10. An element-isolation insulating film 13 comprised of a silicon oxide film is formed on the surface of the P type silicon substrate 10 and an MOS transistor is formed at an area defined by the element-isolation insulating film 13. The MOS transistor comprises source and drain regions 11 and 12, a gate insulating film 21, a gate electrode comprised of polysilicon, etc. The gate electrode 20 is used as a word line WL. An interlayer insulating film 14 of $SiO_2$, etc., is formed on the MOS transistor and a contact hole 22 is formed in the interlayer insulating film 14 and reaches the drain or source region. A ferroelectric capacitor is formed on the interlayer insulating film 14. The ferroelectric capacitor comprises a lower-layer electrode 15, a ferroelectric film 16 comprised of a PZT (lead zirconate titanate) film, etc., and an upper-layer electrode 17.

The lower-layer electrode 15 is called as a plate electrode or plate line PL. The ferroelectric capacitor is covered with an interlayer insulating film 18 comprised of a silicon oxide film for instance. The ferroelectric capacitor is electrically connected to the drain or source region through a contact hole 22 in the interlayer insulating film 18, that is, through an interconnect line 19 of aluminum for instance which extends into the contact hole 22. The source or drain region is electrically connected to a metal interconnect line 23 buried in the interlayer insulating layer 14, the metal interconnect line 23 being formed of a polycide such as MoSi and being used as a bit line BL.

Figure 2:
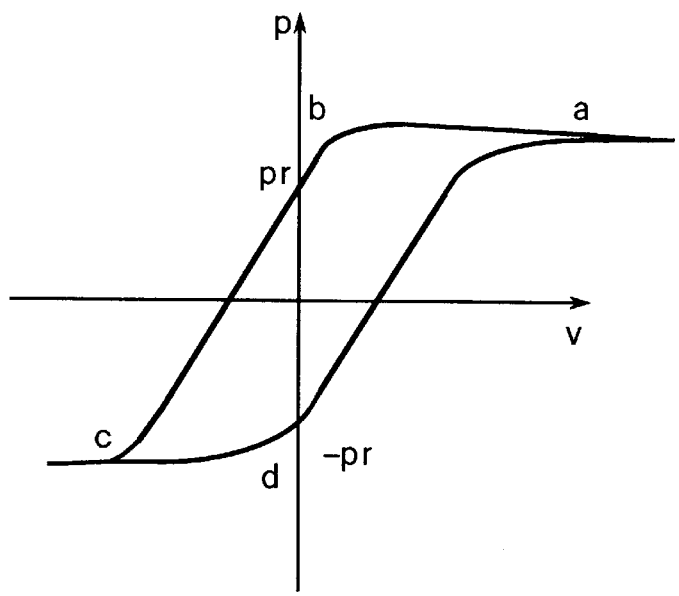
FIG. 2 is a view showing a characteristic (hysteresis characteristic) between an application voltage on a ferroelectric thin film and a polarization characteristic.

FIG. 2 shows a relation between an application voltage of a piezoelectric thin film, such as the PZT film, and the polarization characteristic. The piezoelectric thin film has a hysteresis characteristic as shown in FIG. 2. And data can be stored depending upon whether the remnant polarization Pr is positive or negative with a voltage not applied, that, V=0(V).

Figure 3:
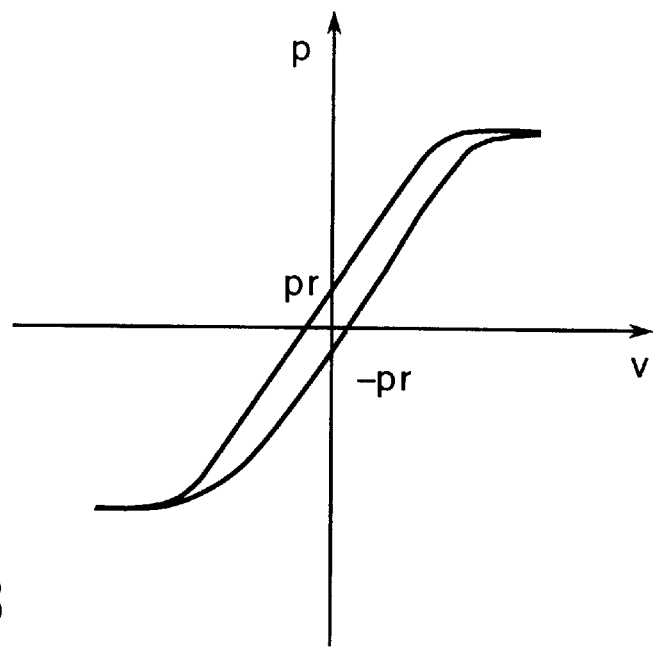
FIG. 3 is a view showing a hysteresis characteristic not desirable as a memory cell.

FIG. 3 shows a hysteresis characteristic not desired as a nonvolatile storage device. This hysteresis characteristic has a very small remnant polarization Pr, thus presenting various problems, such as a lowering in a readout margin by a sense amplifier and a readier data loss resulting from an external disturbance.

Figure 4A:
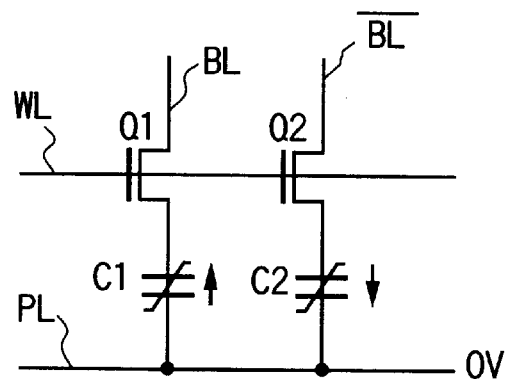
FIGS. 4A and 4B each are views for explaining a write operation of the ferroelectric memory cell.
Figure 4B:
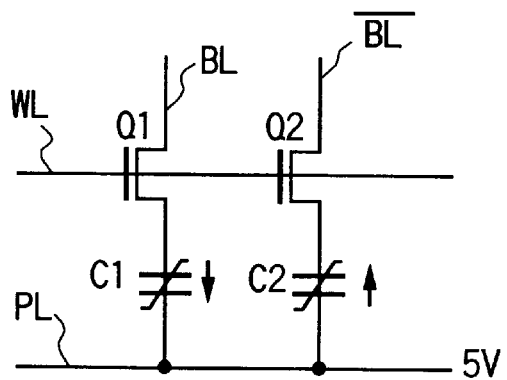

The reading operation of the memory cell using a ferroelectric thin film will be explained below with reference to FIGS. 4A, 4B and 5. A nonvolatile ferroelectric memory using memory cells having the ferroelectric thin film constitutes memory cells each having, for example, two MOS transistors Q1, Q2 and ferroelectric capacitors C1, C2. And a state in FIG. 4A is defined as "1", that is, an upward polarity (here referred to as a positive polarity) emerges at the capacitor C1 as indicated by an upward arrow and a downward polarity (here referred as a negative polarity) as indicated by a downward arrow in FIG. 4A. The state is FIG. B is defined as "0", that is, a negative polarity emerges at a capacitor C1 and a positive polarity at a capacitor C1.

("1" write operation)

Here, a step is shown at which the "1" is written to a memory cell. Now, capacitors C1, C2 are respectively in the d, b state in FIG. 2, that is, in the "0" state.

A 5 V is applied to a bit line BL and a 0 V is applied to a corresponding bit line $\overline{B}$. And a 7 V is applied to a word line WL and a 0 V is applied to a plate electrode PL. As a result, the transistors Q1, Q2 are turned ON and, since the 5 V and 0 V are applied to the capacitors C1 and C2, respectively, the capacitor C1 is transferred to the a state in FIG. 2 and the capacitor C2 stays in the b state in FIG. 2.

Then, the PL becomes the 5 V. As a result, the capacitor C1 is transferred from the a to be b state in FIG. 2 because its application voltage becomes the 0 V. And the capacitor C2 becomes the c state in FIG. 2.

Subsequently, the PL becomes the 0 V and the capacitor C1 becomes the a state in FIG. 2 because its application voltage becomes the 5 V and the capacitor C2 becomes the d state in FIG. 2 because its application voltage becomes the 0 V.

Figure 5:
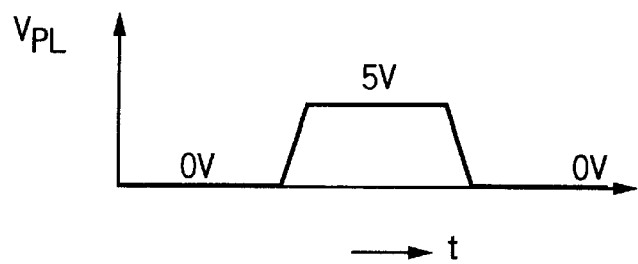
FIG. 5 shows a change in a potential on a plate electrode PL at a write time.

FIG. 5 shows a change of a potential (VPL) on the plate line (plate voltage) PL at a write time.

In this way, the state "write 1" is realized as shown in FIG. 4A, that is, a positive polarity emerges at the capacitor C1 and a negative polarity emerges at the capacitor C2.
("0" write operation)

Here, a step is shown at which a "0" is written in a memory cell. Now the capacitors C1, C2 are set in a "1" state, that is, in the b, d state in FIG. 2, respectively.

First, the 0 V is applied to the bit line BL and a 5 V is applied to the bit line $\overline{BL}$. A 7 V and 0 V are applied to the word line WL and plate line PL, respectively. As a result, the transistors Q1, Q2 are turned ON and, since the 0 V and 5 V are applied to the capacitors C1 and C2, respectively, the capacitor C1 stays in the b state in FIG. 2 and the capacitor C2 is transferred from the d state to the a state in FIG. 2.

Subsequently, the PL becomes the 5 V. As a result, the capacitor C1 is transferred from the b state and the c state in FIG. 2 because −5 V is applied. And the capacitor C2 is transferred from the a state to the b state because the 0 V is applied.

Subsequently, the PL becomes the 0 V. As a result, the capacitor C1 is transferred from the c state to the d state in FIG. 2 because the 0 V is applied and the capacitor C2 is transferred from the b state to the a state in FIG. 2 because the 5 V is applied.

In this way, a "write 0" state is realized, that is, a negative polarization emerges at the capacitor C1 and a positive polarization emerges at the capacitor C2.

Figure 6:
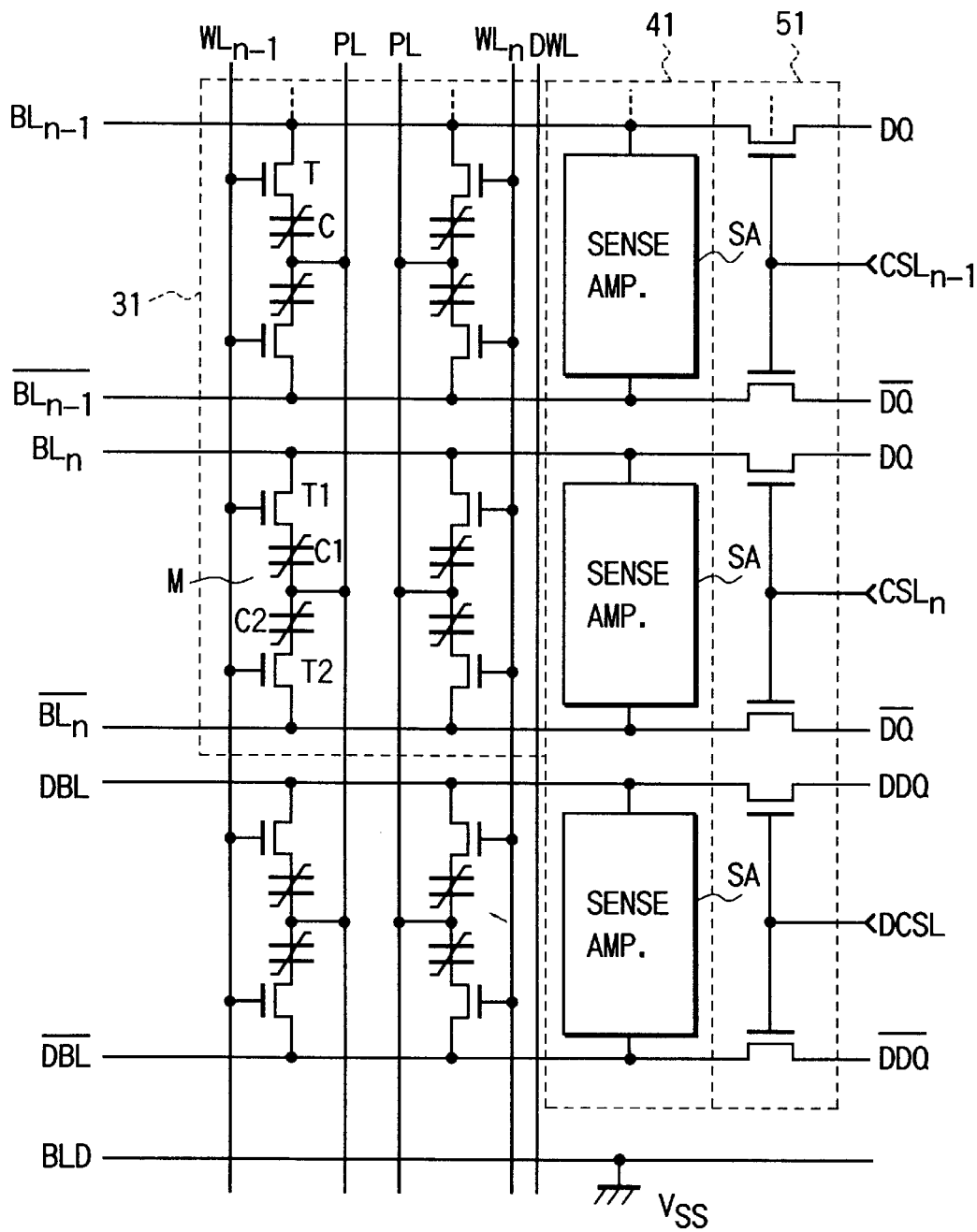
FIG. 6 is a circuit diagram schematically showing a memory cell array of the present invention.

FIG. 6 shows a circuit diagram showing a memory cell section in the nonvolatile ferroelectric memory of the present invention. In the memory cell section, a plurality of memory cells are arranged in rows and columns as a memory cell array. FIG. 6 shows an internal circuit in the memory cell array 31. The memory cell comprises, as shown in FIG. 1, an MOS transistor having a gate 20 and a capacitor having a ferroelectric film 16 of PZT for instance. In this embodiment, one memory cell comprises a two transistors/ two capacitors (2T/2C) array. According to the present invention, the memory cell can be applied not only to the 2T/2C array but also to a one transistor/one capacitor (1T/1C) array.

Now explanation will be given below about such a 2T/2C type memory cell M.

The corresponding plate electrodes PL of the dielectric capacitors C1, C2 are connected together to a plate line PL. The other-side electrodes of the ferroelectric capacitors C1, C2 are connected to the corresponding source or drain regions of the transistors T1, T2, respectively. The drain or source region of each of the transistors T1, T2 is connected to a corresponding bit line BL or $\overline{BL}$ and the gates of the transistors T1, T2 are connected to a word line WL.

In the memory cell array 31, a pair of bit lines BL, $\overline{BL}$ are so arranged that each is connected to the corresponding drain or source region of each of the transistors T1, T2. The bit lines BL, $\overline{BL}$ are so arranged that mutually complementary data are transferred as set out above. A plurality of pairs of bit lines (BL1, $\overline{BL1}$; BL2, $\overline{BL2}$; ..., BLn−1, $\overline{BLn-1}$, BLn, $\overline{BLn}$) are arranged in the memory cell array and, outside the memory cell array, a first dummy bit line DBL is formed so as to avoid the thinning of interconnect line at a time of manufacture and a resultant unbalance of a pattern.

Between the first dummy bit line BLD and a pair of bit lines BLn, $\overline{BLn}$ at an end of the bit line group, a second pair of dummy bit pairs DBL, $\overline{DBL}$ are so arranged as to be connected to a memory cell and to functionally operate, which is an aspect constituting a feature of the present invention. And a second ferroelectric memory cell connected to the second pair of dummy bit lines DBL, $\overline{DBL}$ has a 2T/2C structure having the same size as the first ferroelectric memory cell connected to each bit line pair and the number of ferroelectric memory cells in the same column is the same.

Even if the second pair of dummy bit lines DBL, $\overline{DBL}$ are formed outside the memory cell array, a first dummy bit line is formed outside the second pair of dummy bit lines and, therefore, the memory cell sections including the second dummy bit lines do not ruin their repeated pattern, so that it is possible to effectively prevent the thinning of the interconnect line at a time of manufacture and a resultant unbalance of the pattern.

A respective sense amplifiers SA and I/O gate (column gate) are connected to each bit line pair. Similarly, a corresponding sense amplifiers SA and I/D gate are also connected to the second dummy bit lines DBL, $\overline{DBL}$. As shown, for example, in FIGS. 4A and 4B, mutually complementary data are transferred to the respective bit line pair and second dummy bit line pair. The first dummy bit line BLD is fixed usually to a predetermined potential and, in this embodiment, to a ground potential Vss.

That is, outside the bit line pair BLn, $\overline{BLn}$ at the end of the memory cell, the first dummy line BLD is provided so as to maintain the uniformity of manufacture as in the prior art and, therebetween, the second dummy bit pair DBL, $\overline{DBL}$ are formed which are different in function from the first dummy bit line. In the same way as the other bit lines, the memory cell is connected to the DBL, $\overline{DBL}$. It is also considered that a sense amplifier circuit SA is connected to the DBL, $\overline{DBL}$ and that, by charging and discharging the second dummy bit line together with the associated bit lines, no greater effect is exerted over the capacitive coupling relative to the bit line $\overline{BLn}$ at the end of the memory cell array.

The I/O gate (column gate) of the second dummy bit line pair DBL, $\overline{DBL}$ is rendered ON only at a write time by a column select signal DCSL generated, for example, based on a column select signal CSLn and write-type signal (WE) to enable data which is written from an input/output line, not shown, to be written to a memory cell connected to the second dummy bit line pair DBL, $\overline{DBL}$. Therefore, the data so written to the memory cell is not read out through the I/O gate at a read time, thus preventing the reading, to the outside, of not-required data in the memory cell connected to the second dummy bit line pair DBL, $\overline{DBL}$.

FIG. 7 is a circuit diagram showing a means for generating a control signal DCSL of the I/O gate. This means is comprised of a series circuit of an NAND circuit and inverter circuit to allow the bit line pair BLn, $\overline{BLn}$ at the end of the memory cell array, as well as the second dummy bit line pair DBL, $\overline{DBL}$, to be selected by the same column address. Further, the data transferred to the second dummy bit line pair DBL, $\overline{DBL}$ has an inversion level relation to the data on the corresponding bit line pair so as to effectively suppress a capacitive coupling at the bit line pair at the memory cell array. Put it in more detail, when the BL and $\overline{BL}$ are at the H and L levels, respectively, then the DBL and $\overline{DBL}$ are at the L and H levels, respectively .

As shown in FIG. 6, the word lines (WL1, WL2, ..., WLn−1) connected to the gates of the transistors T1, T2 and plate lines (PL1, PL2, ..., PLn−1, PLn) are alternately arranged at the memory cell array 31. The dummy word line DWL is provided outside the word line WLn so as to improve the thinning of the interconnect line at a time of manufacture and a resultant unbalance in the pattern.

Figure 8:
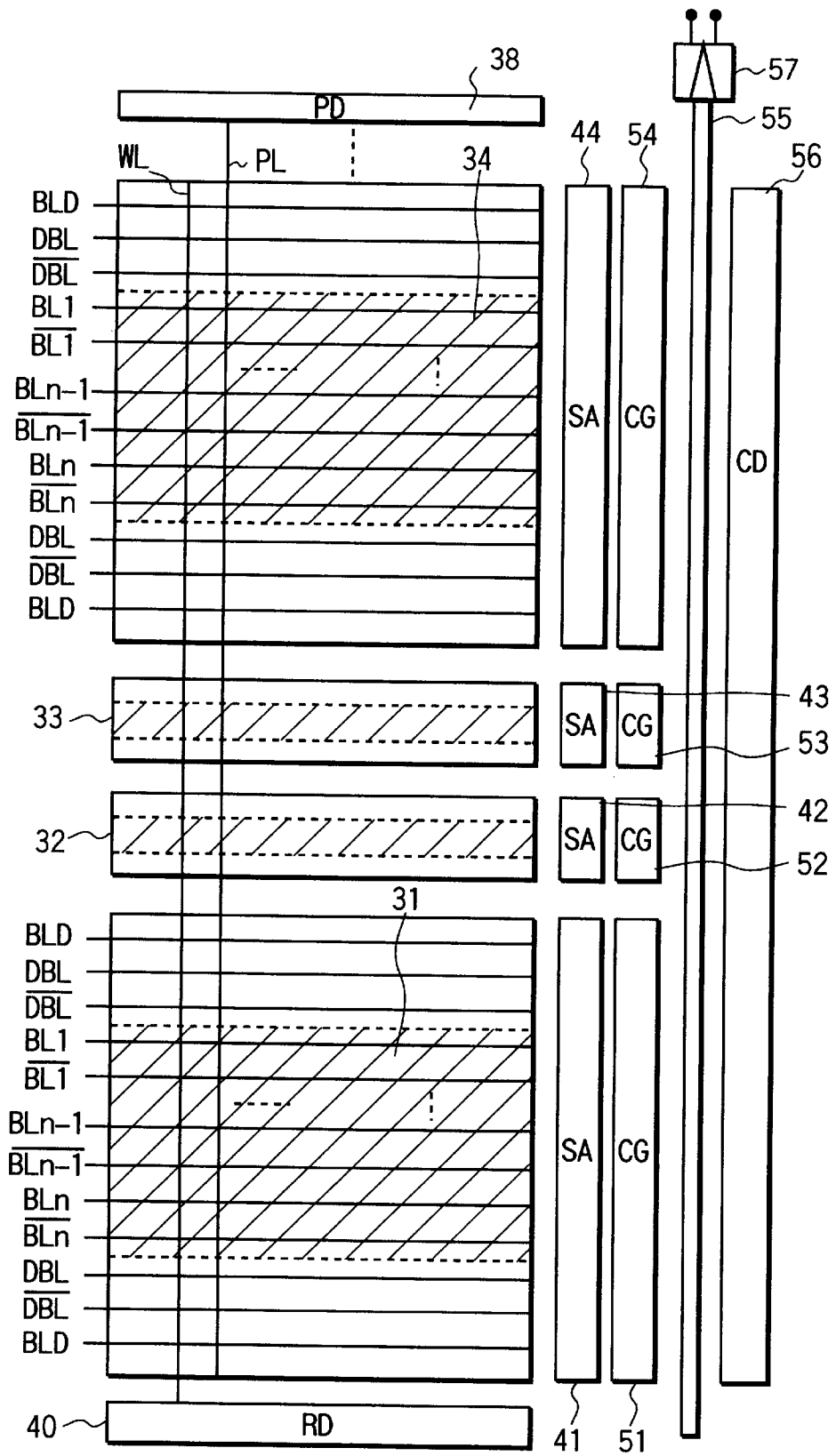
FIG. 8 is a block diagram showing a memory cell array and peripheral circuit in the ferroelectric memory of the present invention.

FIG. 8 shows an arrangement of a memory cell array in a nonvolatile ferroelectric memory and its periphery circuit. In this arrangement, a plurality of memory cell arrays 31 to 34 are arranged in parallel and a row decoder circuit (RD) 40 is shared among the memory cell arrays 31 to 34. A word line WL is selected by the row decoder circuit 40 in accordance with a corresponding address signal coming from an outside. A plate line PL is shared among these memory cell arrays and driven by a plate line drive circuit (PD) 38 as shown in FIG. 5.

The row decoder circuit 40 and plate line drive circuit 38 may be attached to the respective memory cell arrays 31 to 34 and, for example, attached between the adjacent memory cell arrays 31 to 34.

Sense amplifier circuits (SA) 41 ... 44 are provided at the corresponding memory cell arrays, amplifying a very small potential difference emerging on the bit line BL at a reading time. Column gate circuits (CGs) 51 to 54 selectively connect the data lines 55 as input/output lines and bit lines BL, $\overline{BL}$ on the basis of a signal on the column select line CSL. The column decoding circuit (CD) 56 selects the CSL line in accordance with an address signal input from an outside.

A data line select amplifying circuit 57 amplifies data on the data lines 55. The column gate circuits 51 to 54 comprise column gates (I/O gates) connected at each bit line pair and the respective column gate is comprised of two MOS transistors. These MOS transistors are selectively driven by a column select line CSL.

For the memory cell arrays 31 ... 34, their respective bit lines are arranged as pairs BL1, $\overline{BL1}$; BL2, $\overline{BL2}$; ... BLn−1, $\overline{BLn-1}$; and BLn, $\overline{BLn}$. At the outer sides of these memory cell arrays, the first dummy bit line BLD is provided so as to ensure working uniformity of the memory cell arrays at a time of manufacture. And the second dummy bit line pair DBL, $\overline{DBL}$ are arranged between the first dummy bit line BLD and the bit line $\overline{BLn}$ at the end of the bit line group. A repetition pattern, same as those of the bit line pairs BL1, $\overline{BL1}$; BL2, $\overline{BL2}$; ... BLn−1, $\overline{BLn-1}$; and BLn, $\overline{BLn}$, is provided at the second dummy bit lines DBL, $\overline{DBL}$.

Although, in the above-mentioned embodiment, the PZT ferroelectric film has been explained by way of example, the present invention is not restricted thereto. The embodiment can also be applied to, for example, $BaTiO_3$ (BTO), etc., film as shown in FIG. 9. Needless to say, it can be applied to a (Pb, La), (Zr, Ti) $O_3$ (PLZT), $LiNbO_3$, $K_3Li_2Nb_5O_{15}$, etc., film.

Figure 11:
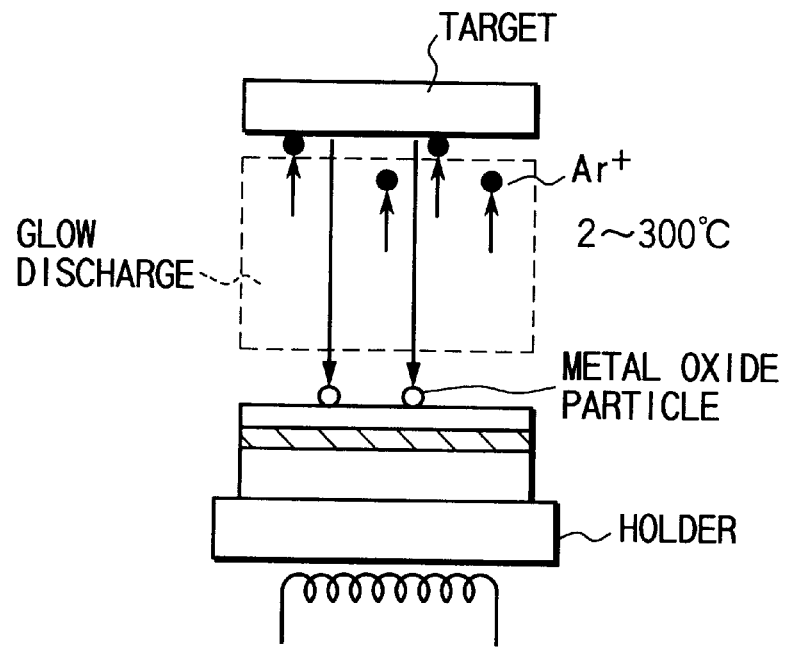
FIG. 11 is a view for explaining a principle of a sputtering method.
Figure 12:
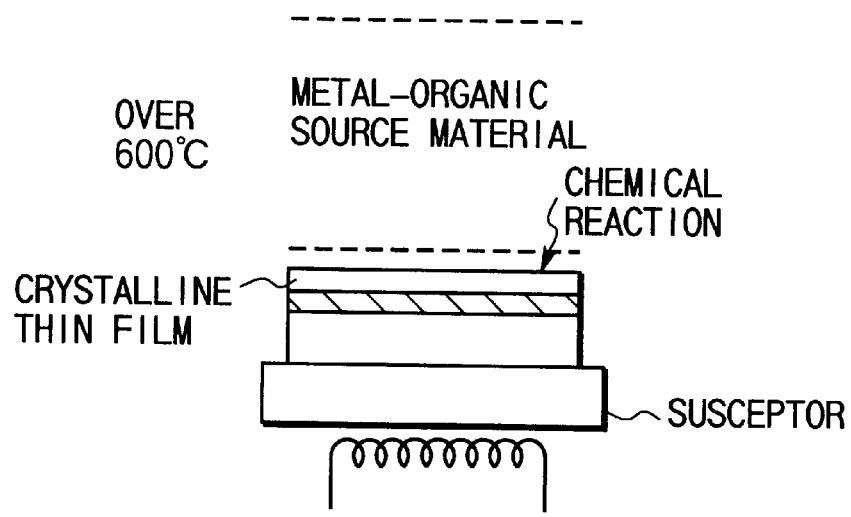
FIG. 12 is a view for explaining a principle of an MOCVD method.

A manufacturing process of a ferroelectric thin film will be explained below with reference to FIGS. 10 to 12. In this manufacturing process, use is made of, for example, a sol/gel method, sputtering method and MOCVD (metal organic CVD) method. It is with a sol/gel method and sputtering method that a marked effect is obtained in combination.

The sol/gel method or MOD (metal organic decomposition) method is the method by which a substrate is dipped into, or spin-coated with, a solution with a metal organic compound etc., used as a source material and subjects it to thermal decomposition. This film formation can be made even in the air and a film can be formed over a wider area on the substrate (see FIG. 10).

The sputtering method is by causing an ionized gas (an Ar gas for instance) to impinge under a glow discharge on a target of a material for the formation of a thin film and a resultant ejected particles to be deposited on the substrate. This method can form a film of a high melting point material, etc., hard to be film-formed in a vacuum deposition method. This film formation method includes a laser ablation as well as the DC, radio-frequency (RF), magnetron, ion-beam and reactive, etc., sputtering. As the target use is made of a sintered mass or powder and the sputtering is done in an atmosphere of argon and oxygen. With a magnet put in the vicinity of the target, the sputter ions are restricted under a magnetic field and the sputtering is possible under a low gas pressure (about $10^{-4}$ Torrs). And the film growth speed is made several times as high. The fine structure and characteristic of the ferroelectric film depend upon the sputtering conditions, such as the sputtering voltage, gas composition and pressure, film formation speed, substrate material and substrate temperature (see FIG. 11).

The basics of the CVD comprise introducing a gas component or components of the compounds elements for film formation into a high-temperature furnace and depositing a film on the surface of the substrate. The gasified compound component has its film formed in equilibrium on the surface of the substrate and there is a possibility that more homogeneous crystal film will be obtained. The MOCVD comprises forming a ferroelectric film from the organic metal acetylacetonato and alkoxide as a row material (see FIG. 12).

Now explanation will be given about an example of applying an FRAM to an RFID (Radio Frequency Identification) system.

Figure 13A:
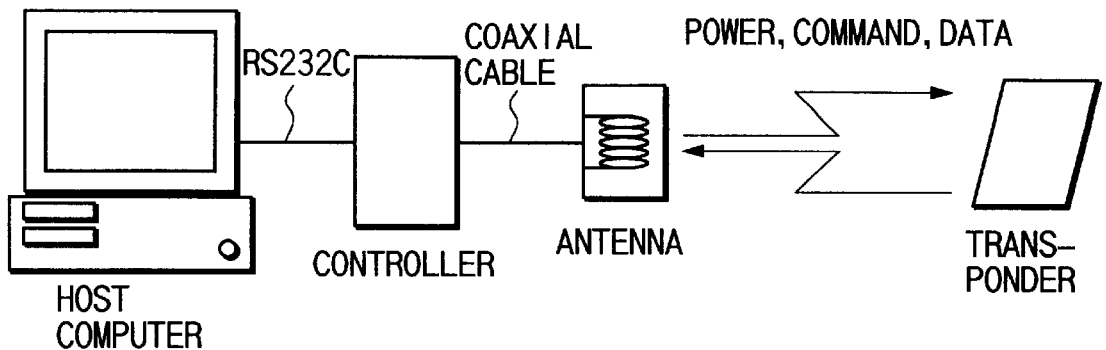
FIG. 13A is a diagrammatic view showing a FRID system.
Figure 13B:
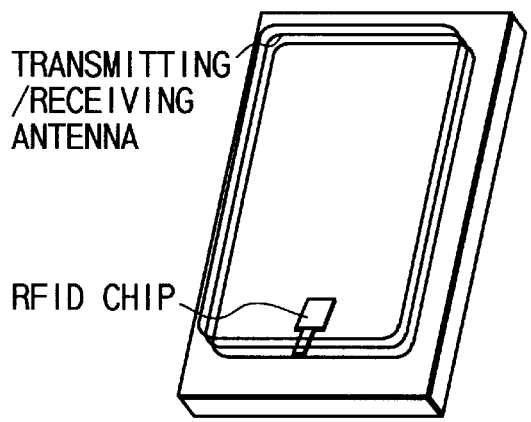
FIG. 13B is a diagrammatic view showing the FRID system.
Figure 13C:
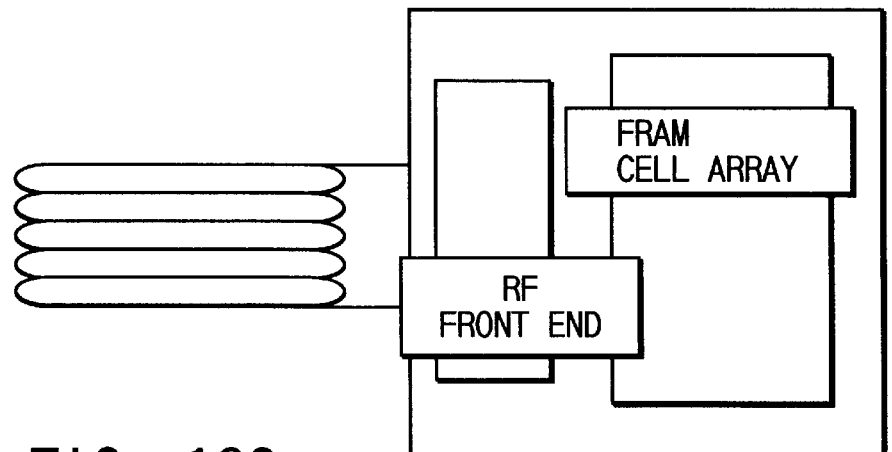
FIG. 13C is a block diagram showing an arrangement of a transponder in the FRID system.

The RFID system comprises a non-contacting tag system (identification system) and is generally called a non-contacting data carrier system. The whole arrangement of the RFID system is shown in FIG. 13.

The RFID system comprises a host computer side including a personal computer, controller, antenna, etc., and a data carrier called a transponder. The transponder is of such a structure as to include a monolithic RFID chip with one chip version of the FRAM and ASIC incorporated therein and an antenna functioning as a power reception and data receive/transmit unit.

The host side transmits a command and data on a carrier as required and the transponder side generates requisite power through the carrier, utilizes it for data read/write and transmission and returns associated information back to the host side.

The non-contacting tag requires no battery unit and reads storage contents in the FRAM in a non-contacting fashion through a radio wave and rewrite them, so that they can be utilized in the management of a person's entering and leaving a room. For example, a person can pass through a station's gate with a non-contacting tag for a season ticket put in his or her clothing pocket, drive a car along an express highway with such a tag attached thereto and pass through the tollgate without having to be stopped there for payment of a toll, or monitor/manage the entering and departure of cars into and from the parking lot with no attendants there. The non-contacting tag can also be utilized to control the behavior of migrating fish or livestock.

Figure 14:
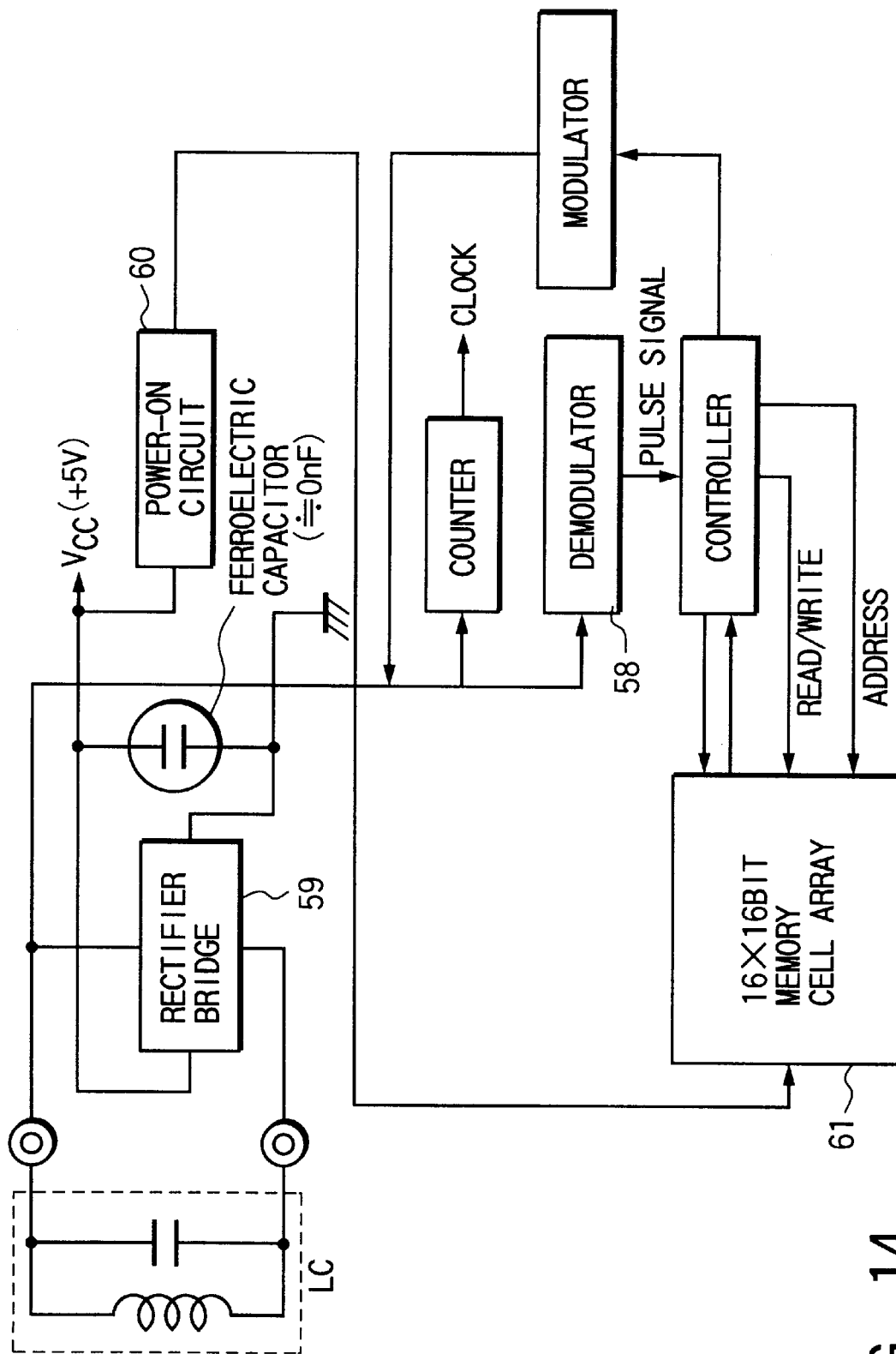
FIG. 14 is a view showing an internal circuit in the transponder.

FIG. 14 shows a detail of an internal circuit of the transponder.

That is, it comprises, for example, an LC circuit for detecting an electromagnetic field input from an outside, a circuit (FSK demodulation circuit) 58 for creating a signal from the detected electromagnetic field, a circuit (a rectifier bridge) 59 for generating a power supply voltage from the electromagnetic field detected at the LC circuit, a power-ON circuit 60 for detecting a rise in the power supply voltage and outputting a power-ON signal, an FRAM cell array 61 comprising a matrix array of memory cells constituted by ferroelectric capacitors (each capacitor having a ferroelectric film formed between its electrodes) and charge transfer MOS transistors in which those MOS transistors in the same row are commonly connected to a corresponding word line, those ferroelectric capacitors of the memory cell arrays in the same row have their one-side electrodes commonly connected to a corresponding capacitor plate line and the MOS transistors of those memory cells in the same column have their one-side terminals commonly connected to a corresponding bit line.

The present invention can be applied not only to the above-mentioned FRAM but also to a ferroelectric memory cell section used, though in smaller area, in a logic program section in those logic LSI's with an FPGA (field programmable gate array) or static type RAM mounted therein.

Further, the present invention can be applied not only to the case where a ferroelectric memory cell is formed on the above-mentioned semiconductor substrate but a ferroelectric memory cell is formed on a semiconductor layer on an insulating substrate, such as an SOI (silicon on insulator).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A nonvolatile ferroelectric memory comprising:
   a memory cell array having a plurality of memory cells arranged in rows and columns, each of the memory cells comprising a charge transfer transistor having a source and a drain region and a gate electrode and a ferroelectric capacitor for information storage which has two electrodes, one of the two electrodes being connected to one of the source and the drain region of the transistor;
   a plurality of word lines each connected to the gate electrode of the transistor in each of the memory cells;
   a plurality of plate lines each connected to the other of the two electrodes of the ferroelectric capacitor in each of the memory cells;
   a plurality of bit lines each connected to the other of the source and the drain region of the transistor in each of the memory cells;
   a first dummy bit line arranged outside the memory cell array and substantially parallel to the bit line; and
   second dummy bit lines arranged between the memory cell array and the first dummy bit line and constituting a dummy bit line pair.

2. The nonvolatile ferroelectric memory according to claim 1, wherein the second dummy lines are connected to dummy memory cells which are substantially the same in configuration and size and in number as those memory cells connected to one of the bit lines arranged at the end of the memory cell array, the dummy memory cells being connected to corresponding ones of the word and the plate lines.

3. The nonvolatile ferroelectric memory according to claim 1, wherein the first dummy bit line is fixed to a predetermined potential.

4. The nonvolatile ferroelectric memory according to claim 1, wherein the second dummy bit lines, together with the plurality of bit lines, vary in potential.

5. The nonvolatile ferroelectric memory according to claim 1, wherein both the plurality of bit lines and the second dummy bit lines constitute pairs of signal lines supplied with complementary signals and the plurality of memory cells are connected to the pair of signal lines correspondingly.

6. The nonvolatile ferroelectric memory according to claim 1, wherein dummy memory cells are connected to each of the second dummy bit lines, each of the dummy memory cells comprising a dummy transistor for charge transfer which has a source and a drain region one of which connected to one of the second dummy bit lines and a gate connected to the corresponding one of the word lines, and a dummy ferroelectric capacitor for information storage which has one electrode connected to a corresponding one of the plate lines and the other electrode connected to the other of the source and the drain region of the dummy transistor.

7. The nonvolatile ferroelectric memory according to claim 6, wherein the dummy memory cells equal in number to those memory cells connected to each of the bit lines are connected to each of the second dummy bit lines.

8. The nonvolatile ferroelectric memory according to claim 1, further comprising a sense amplifier and I/O gates connected to the second dummy bit lines.

9. The nonvolatile ferroelectric memory according to claim 8, wherein the second dummy lines are connected to input/output lines by opening the I/O gates when data is written and disconnected from the input/output lines by closing the I/O gates when data is read out.

10. The nonvolatile ferroelectric memory according to claim 1, wherein mutually opposite level signals are transferred to one of the bit lines at the end of the memory cell array and one of the second dummy bit lines adjacent to the one of the bit lines.

11. The nonvolatile ferroelectric memory according to claim 1, wherein a column address of one of the bit lines at the end of the memory cell array coincides with a column address of adjacent one of the second dummy bit lines.

12. A nonvolatile ferroelectric memory comprising:
   a memory cell array having a plurality of memory cells arranged in rows and columns, each of the memory cells comprising a charge transfer transistor having a source and a drain region and a gate electrode and a ferroelectric capacitor for information storage which has two electrodes, one of the two electrodes being connected to one of the source and the drain region of the transistor;
   a plurality of word lines each connected to the gate electrode of the transistor in each of the memory cells;
   a plurality of plate lines each connected to the other of the two electrodes of the ferroelectric capacitor in each of the memory cells;
   a plurality of bit lines each connected to the other of the source and the drain region of the transistor in each of the memory cells;
   at least one dummy bit line arranged outside the memory cell array and substantially parallel to the bit lines and connected to dummy memory cells which are substantially the same in configuration and size and in number as those memory cells connected to one of the bit lines at the end of the memory cell array, the dummy memory cells being connected to the corresponding one of the word and the plate lines.

13. The nonvolatile ferroelectric memory according to claim 12, wherein the at least one dummy bit line includes two dummy bit lines to form a dummy bit line pair to which mutually complementary signals are transferred.

14. The nonvolatile ferroelectric memory according to claim 13, wherein the dummy bit line pair has a pattern substantially the same as that of a bit line pair at the end of the memory cell array.

15. The nonvolatile ferroelectric memory according to claim 14, wherein the bit line pair include a first bit line to which first data is transferred and a second bit line to which data complementary to the first data is transferred; the dummy bit line pair includes a first dummy bit line to which second data is transferred and a second dummy bit line to which data complementary to the second data is transferred; a second bit line of the bit line pair at the end of the memory cell array is arranged adjacent to the first dummy bit line of the dummy bit line pair; and the complementary data to the first data transferred to the second bit line and second data transferred to the first dummy bit line have substantially the same level.

16. A nonvolatile ferroelectric memory comprising:
a memory cell array having a plurality of memory cells arranged in rows and columns, each of the memory cells comprising a charge transfer transistor having a source and a drain region and a gate electrode and a ferroelectric capacitor for information storage which has two electrodes, one of the two electrodes being connected to one of the source and the drain region of the transistor;
a plurality of word lines each connected to the gate electrode of the transistor in each of the memory cells;
a plurality of plate lines each connected to the other of the two electrodes of the ferroelectric capacitor in each of the memory cells;
a plurality of bit lines each connected to the other of the source and the drain region of the transistor in each of the memory cells; and
a dummy bit line pair arranged outside the memory cell array and substantially parallel to the bit lines, wherein the plurality of bit lines form a plurality of bit line pairs; a bit line pair at the end of the memory cell array includes a first bit line to which first data is transferred and a second bit line to which data complementary to the first data is transferred; the dummy bit line pair includes a first dummy bit line to which second data is transferred and a second dummy bit line to which data complementary to the second data is transferred; a second bit line of the bit line pair at the end of the memory cell array is arranged adjacent to the first dummy bit line of the dummy bit line pair; and the complimentary data to the first data transferred to the second bit line and the second data transferred to the first dummy bit line have substantially the same level.

17. The nonvolatile ferroelectric memory according to claim 16, wherein a plurality of dummy memory cells are connected to each of the first and the second dummy bit lines, each of the dummy memory cells comprising a charge transfer transistor having a source and a drain region, one of which is connected to the corresponding dummy bit line, and a gate electrode connected to a corresponding one of the word lines and a ferroelectric capacitor for information storage having one electrode connected to a corresponding one of the plate lines and the other electrode connected to the other of the source and the drain region of the charge transfer transistor.

18. The nonvolatile ferroelectric memory according to claim 17, wherein the memory cells and the dummy memory cells have substantially the same configuration and size.

19. The nonvolatile ferroelectric memory according to claim 17, wherein the dummy memory cells connected to each of the first and the second dummy bit lines are equal in number to the memory cells connected to any one of the bit lines.

20. The nonvolatile ferroelectric memory according to claim 17, wherein each of the word and the plate lines is connected to the memory cells and the dummy memory cells in the same one of the rows and each of the bit lines is connected to the memory cells in the same one of the columns.

21. A radio frequency identification system comprising:
a host side having a host computer, a controller connected to the personal computer, and a first antenna connected to the controller; and
a transponder having a monolithic IC chip including a nonvolatile ferroelectric memory and a control circuit, and a second antenna for data transmission/reception and for power reception,
wherein the nonvolatile ferroelectric memory comprises:
a memory cell array having a plurality of memory cells arranged in rows and columns, each of the memory cells comprising a charge transfer transistor having a source and a drain region and a gate electrode and a ferroelectric capacitor for information storage which has two electrodes, one of the two electrodes being connected to one of the source and the drain region of the transistor;
a plurality of word lines each connected to the gate electrode of the transistor in each of the memory cells;
a plurality of plate lines each connected to the other of the two electrodes of the ferroelectric capacitor in each of the memory cells;
a plurality of bit lines each connected to the other of the source and the drain region of the transistor in each of the memory cells;
a first dummy bit line arranged outside the memory cell array and substantially parallel to the bit line; and
second dummy bit lines arranged between the memory cell array and the first dummy bit line and constituting a dummy bit line pair.

22. The radio frequency identification system according to claim 21, wherein the second dummy lines of the nonvolatile ferroelectric memory are connected to dummy memory cells which are substantially the same in configuration and size and in number as those memory cells connected to one of the bit lines arranged at the end of the memory cell array, the dummy memory cells being connected to corresponding ones of the word and the plate lines.

23. The radio frequency identification system according to claim 21, wherein the second dummy bit lines of the nonvolatile ferroelectric memory, together with the plurality of bit lines, vary in potential.

24. The radio frequency identification system according to claim 21, further comprising a sense amplifier and I/O gates connected to the second dummy bit lines, wherein the second dummy lines are connected to input/output lines by opening the I/O gates when data is written and disconnected from the input/output lines by closing the I/O gates when data is read out.

25. The radio frequency identification system according to claim 21, wherein the nonvolatile ferroelectric memory has an operation that mutually opposite level signals are transferred to one of the bit lines at the end of the memory cell array and one of the second dummy bit lines adjacent to the one of the bit lines.

26. A transponder for a radio frequency identification system comprising:
- a monolithic IC including a nonvolatile ferroelectric memory and a control circuit; and
- a second antenna for data transmission/reception and for power reception,
- wherein the nonvolatile ferroelectric memory comprises:
    - a memory cell array having a plurality of memory cells arranged in rows and columns, each of the memory cells comprising a charge transfer transistor having a source and a drain region and a gate electrode and a ferroelectric capacitor for information storage which has two electrodes, one of the two electrodes being connected to one of the source and the drain region of the transistor;
    - a plurality of word lines each connected to the gate electrode of the transistor in each of the memory cells;
    - a plurality of plate lines each connected to the other of the two electrodes of the ferroelectric capacitor in each of the memory cells;
    - a plurality of bit lines each connected to the other of the source and the drain region of the transistor in each of the memory cells;
    - a first dummy bit line arranged outside the memory cell array and substantially parallel to the bit line; and
    - second dummy bit lines arranged between the memory cell array and the first dummy bit line and constituting a dummy bit line pair.

27. The transponder according to claim 26, wherein the second dummy lines of the nonvolatile ferroelectric memory are connected to dummy memory cells which are substantially the same in configuration and size and in number as those memory cells connected to one of the bit lines arranged at the end of the memory cell array, the dummy memory cells being connected to corresponding ones of the word and the plate lines.

28. The transponder according to claim 26, wherein the second dummy bit lines of the nonvolatile ferroelectric memory, together with the plurality of the bit lines, vary in potential.

29. The transponder according to claim 26, further comprising a sense amplifier and I/O gates connected to the second dummy bit lines, wherein the second dummy lines are connected to input/output lines by opening the I/O gates when data is written and disconnected from the input/output lines by closing the I/O gates when data is read out.

30. The transponder according to claim 26, wherein the nonvolatile ferroelectric memory has an operation that mutually opposite level signals are transferred to one of the bit lines at the end of the memory cell array and one of the second dummy bit lines adjacent to the one of the bit lines.

31. A monolithic IC chip comprising:
- a nonvolatile ferroelectric memory; and
- a control circuit, wherein the nonvolatile ferroelectric memory comprises:
    - a memory cell array having a plurality of memory cells arranged in rows and columns, each of the memory cells comprising a charge transfer transistor having a source and a drain region and a gate electrode and a ferroelectric capacitor for information storage which has two electrodes, one of the two electrodes being connected to one of the source and the drain region of the transistor;
    - a plurality of word lines each connected to the gate electrode of the transistor in each of the memory cells;
    - a plurality of plate lines each connected to the other of the two electrodes of the ferroelectric capacitor in each of the memory cells;
    - a plurality of bit lines each connected to the other of the source and the drain region of the transistor in each of the memory cells;
    - a first dummy bit line arranged outside the memory cell array and substantially parallel to the bit line; and
    - second dummy bit lines arranged between the memory cell array and the first dummy bit line and constituting a dummy bit line pair.

32. The monolithic IC chip according to claim 31, wherein the second dummy lines of the nonvolatile ferroelectric memory are connected to dummy memory cells which are substantially the same in configuration and size and in number as those memory cells connected to one of the bit lines arranged at the end of the memory cell array, the dummy memory cells being connected to corresponding ones of the word and the plate lines.

33. The monolithic IC chip, according to claim 31, wherein the second dummy bit lines of the nonvolatile ferroelectric memory, together with the plurality of bit lines, vary in potential.

34. The monolithic IC chip according to claim 31, further comprising a sense amplifier and I/O gates connected to the second dummy bit lines, wherein the second dummy lines are connected to input/output lines by opening the I/O gates when data is written and disconnected from the input/output lines by closing the I/O gates when data is read out.

35. The monolithic IC chip according to claim 31, wherein the nonvolatile ferroelectric memory has an operation that mutually opposite level signals are transferred to one of the bit lines at the end of the memory cell array and one of the second dummy bit lines adjacent to the one of the bit lines.

36. A transponder for a radio frequency identification system comprising:
- an LC circuit for detecting an electromagnetic field applied from outside;
- a signal generating circuit for generating a signal from the electromagnetic field detected by the LC circuit;
- a power supply circuit for generating a power supply voltage from the electromagnetic field detected by the LC circuit;
- a power-on circuit for outputting a power-on signal by detecting a rising edge of the power supply voltage; and
- a nonvolatile ferroelectric memory comprising:
    - a memory cell array having a plurality of memory cells arranged in rows and columns, each of the memory cells comprising a charge transfer transistor having a source and a drain region and a gate electrode and a ferroelectric capacitor for information storage which has two electrodes, one of the two electrodes being connected to one of the source and the drain region of the transistor;
    - a plurality of word lines each connected to the gate electrode of the transistor in each of the memory cells;
    - a plurality of plate lines each connected to the other of the two electrodes of the ferroelectric capacitor in each of the memory cells;
    - a plurality of bit lines each connected to the other of the source and the drain region of the transistor in each of the memory cells;
    - a first dummy bit line arranged outside the memory cell array and substantially parallel to the bit line; and second dummy bit lines arranged between the memory cell array and the first dummy bit line and constituting a dummy bit line pair.

37. The transponder according to claim 36, wherein the second dummy lines of the nonvolatile ferroelectric memory are connected to dummy memory cells which are substantially the same in configuration and size and in number as those memory cells connected to one of the bit lines arranged at the end of the memory cell array, the dummy memory cells being connected to corresponding ones of word and the plate lines.

38. The transponder according to claim 36, wherein the second dummy bit lines of the nonvolatile ferroelectric memory, together with the plurality of bit lines, vary in potential.

39. The transponder according to claim 36, further comprising a sense amplifier and I/O gates connected to the second dummy bit lines, wherein the second dummy lines are connected to input/output lines by opening the I/O gates when data is written and disconnected from the input/output lines by closing the I/O gates when data is read out.

40. The transponder according to claim 36, wherein the nonvolatile ferroelectric memory has an operation that mutually opposite level signals are transferred to one of the bit lines at the end of the memory cell array and one of the second dummy bit lines adjacent to the one of the bit lines.

* * * * *